United States Patent
Jang et al.

(10) Patent No.: US 9,901,006 B2
(45) Date of Patent: Feb. 20, 2018

(54) CONTROL CIRCUIT FOR FAN

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Jiing-Shyang Jang, New Taipei (TW); Meng-Liang Yang, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 404 days.

(21) Appl. No.: 14/804,864

(22) Filed: Jul. 21, 2015

(65) Prior Publication Data

US 2017/0027080 A1    Jan. 26, 2017

(51) Int. Cl.
  *G05D 7/00*    (2006.01)
  *G05D 11/00*   (2006.01)
  *H05K 7/20*    (2006.01)
  *G05B 15/02*   (2006.01)

(52) U.S. Cl.
  CPC ......... *H05K 7/20209* (2013.01); *G05B 15/02* (2013.01); *H05K 7/20836* (2013.01)

(58) Field of Classification Search
  CPC ...................................................... G05B 15/02
  USPC ........................................................ 700/282
  See application file for complete search history.

(56) References Cited

U.S. PATENT DOCUMENTS

| | | | |
|---|---|---|---|
| 6,259,172 B1 * | 7/2001 | Lee .......................... | G06F 1/206 307/116 |
| 2008/0106228 A1 * | 5/2008 | Ye ...................... | H05K 7/20209 318/479 |
| 2010/0066172 A1 * | 3/2010 | Lv ........................... | G05D 23/19 307/64 |
| 2014/0147289 A1 * | 5/2014 | Tian ...................... | F04D 27/008 417/45 |

\* cited by examiner

*Primary Examiner* — Mohammad Ali
*Assistant Examiner* — Md Azad
(74) *Attorney, Agent, or Firm* — ScienBiziP, P.C.

(57) ABSTRACT

A control circuit for a fan includes a temperature sensor, a fan controller, a first power supply unit, a second power supply unit, and a control unit. The second power supply unit supplies power to the fan, controlled by the control unit, when an electronic device is powered on. The first power supply unit supplies power to the fan controlled by the control unit, when the electronic device is in a standby mode.

8 Claims, 1 Drawing Sheet

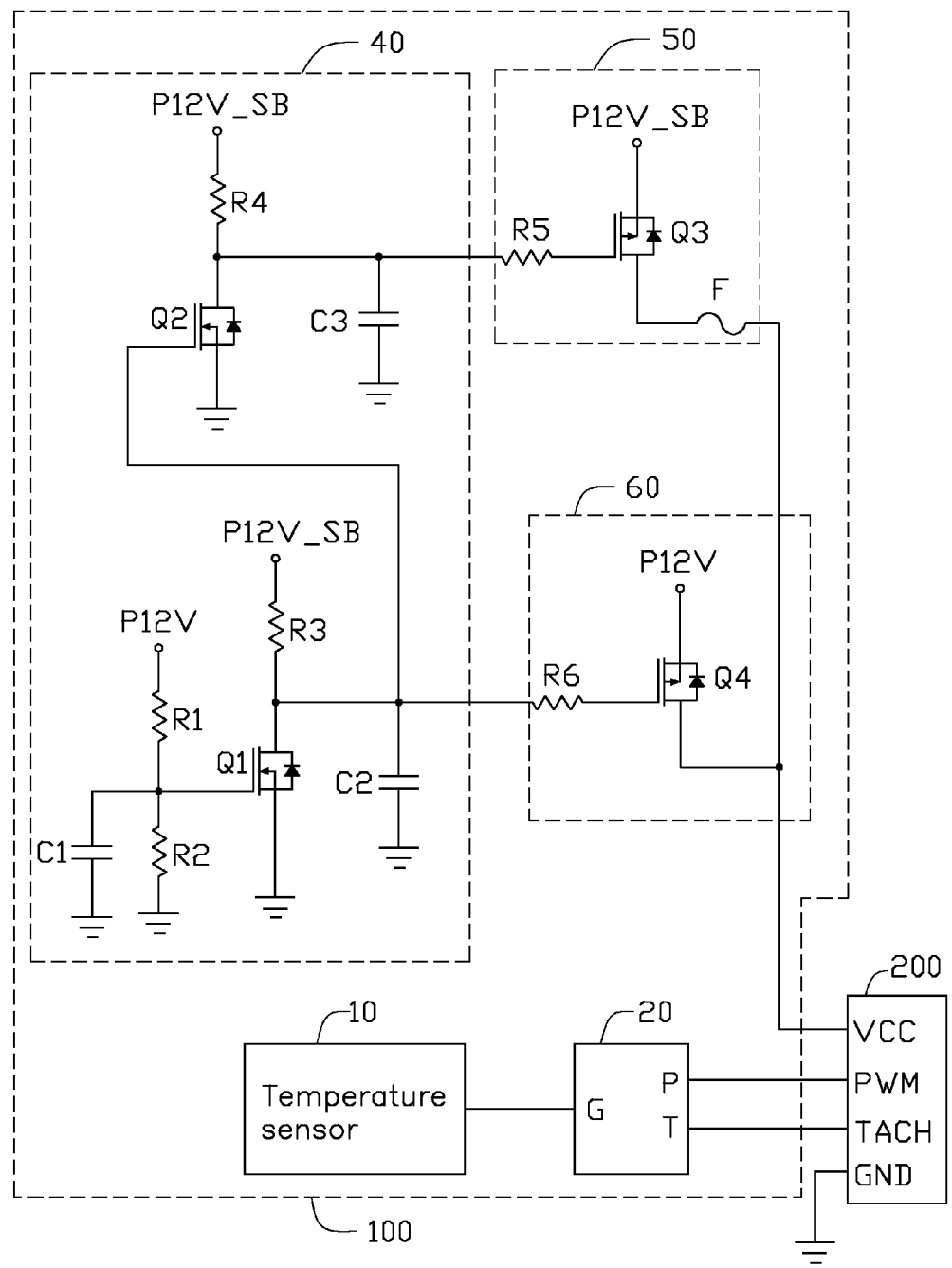

US 9,901,006 B2

CONTROL CIRCUIT FOR FAN

FIELD

The subject matter herein generally relates to a control circuit for a fan.

BACKGROUND

Data centers generate a substantial amount of heat even when in standby. However fans which cool the data centers usually cease operation during standby.

BRIEF DESCRIPTION OF THE DRAWINGS

Implementations of the present technology will now be described, by way of example only, with reference to the attached FIGURE.

The FIGURE is a circuit diagram of an example embodiment of a control circuit for fan.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

The present disclosure is described in relation to a control circuit 100.

The FIGURE illustrates an embodiment of the control circuit 100 for a fan 200 positioned in an electronic device. The control circuit 100 can comprise a temperature sensor 10, a fan controller 20, a control unit 40, a first power supply unit 50, and second power supply unit 60.

The temperature sensor 10 is configured to sense temperature of the electronic device and then output a temperature signal.

The fan controller 20 is configured to control a speed of the fan according to the temperature signal received. The fan controller 20 can comprise a bus pin G, a pulse width modulation signal output pin P, and a speed pin T. The bus pin G is coupled to the temperature sensor 10 for receiving the temperature signal. The pulse width modulation signal output pin P is coupled to a pulse width modulation signal pin PWM of the fan 200 for controlling the speed of the fan 200. The speed pin T is coupled to a fan speed pin TACH of the fan 200 for receiving a fan speed signal.

The control unit 40 can comprise electronic switches Q1, Q2, resistors R1-R4, and capacitors C1-C3. A control terminal of the electronic switch Q1 is coupled to a system power supply P12V through a resistor R1. The control terminal of the electronic switch Q1 is also coupled to ground through the capacitor C1 and the resistor R2 in parallel. A first terminal of the electronic switch Q1 is coupled to a standby power supply P12V_SB through the resistor R3. A second terminal of the electronic switch Q1 is coupled to ground. The first terminal of the electronic switch Q1 is coupled to a power pin VCC of the fan 200 through the second power supply unit 60. The first terminal of the electronic switch Q1 is also coupled to ground through the capacitor C2. A control terminal of the electronic switch Q2 is coupled to the first terminal of the electronic switch Q1. A first terminal of the electronic switch Q2 is coupled to the standby power supply P12V_SB through the resistor R4. A second terminal of the electronic switch Q2 is coupled to ground. The first terminal of the electronic switch Q2 is coupled to the power pin VCC of the fan 200 through the first power supply unit 50. The first terminal of the electronic switch Q2 is also coupled to ground through the capacitor C3.

The first power supply unit 50 can comprise a resistor R5, an electronic switch Q3, and a fuse F. A control terminal of the electronic switch Q3 is coupled to the first terminal of the electronic switch Q2 through the resistor R5. A first terminal of the electronic switch Q3 is coupled to the standby power supply P12V_SB. A second terminal of the electronic switch Q3 is coupled to the power pin VCC of the fan 200 through the fuse F.

The second power supply unit 60 can comprise a resistor R6 and an electronic switch Q4. A control terminal of the electronic switch Q4 is coupled to the first terminal of the electronic switch Q1 through the resistor R6. A first terminal of the electronic switch Q4 is coupled to the system power supply P12V. A second terminal of the electronic switch Q4 is coupled to the power pin VCC of the fan 200.

In at least one embodiment, each of the electronic switches Q1, Q2 is an n-channel field-effect transistor (FET), each of the electronic switches Q3, Q4 is a p-channel FET, and the control terminal, the first terminal, and the second terminal of each of the electronic switches Q1-Q4 are a gate, a source, and a drain of the FET, respectively. In at least one embodiment, each of the electronic switches Q1, Q2 can be an npn bipolar junction transistor (BJT) and each of the electronic switches Q1, Q2 can be a pnp BJT. In other embodiments, each of the electronic switches Q1-Q4 can be other switches having the similar functions. The fuse FS in the embodiment is used to prevent short circuits.

In use, when the electronic device is in an active mode, the system power supply P12V and the standby power supply P12V_SB operate. The control terminal of the electronic switch Q1 is at a high level and the electronic switch Q1 is turned on. The control terminal of the electronic switch Q2 is at a low level and the electronic switch Q2 is turned off. The control terminal of the electronic switch Q3 is at a high level and the electronic switch Q3 is turned off. The control terminal of the electronic switch Q4 is at a low level and the electronic switch Q4 is turned on. The system power supply P12V supplies power to the fan 200 through the electronic switch Q4. Meanwhile, the temperature sensor 10 senses the temperature of the electronic device and then outputs the temperature signal to the fan controller 20. The fan controller 20 controls the speed of the fan 200 through the pulse width modulation signal output pin P according to the temperature signal, and receives the fan speed signal of the fan 200 through the speed pin T.

When the electronic device is in a standby mode, the system power supply P12V stops operating and the standby power supply P12V_SB operates. The control terminal of the electronic switch Q1 is at a low level and the electronic switch Q1 is turned off. The control terminal of the electronic switch Q2 is at a high level and the electronic switch Q2 is turned on. The control terminal of the electronic switch Q3 is at a low level and the electronic switch Q3 is turned on. The control terminal of the electronic switch Q4 is at a high level and the electronic switch Q4 is turned off. The standby power supply P12V_SB supplies power to the fan 200 through the electronic switch Q3 and the fuse F. Meanwhile, the temperature sensor 10 senses the temperature of the electronic device and then outputs the temperature signal to the fan controller 20. The fan controller 20 controls the speed of the fan 200 through the pulse width modulation signal output pin P according to the temperature signal and receives the fan speed signal of the fan 200 through the speed pin T. The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A control circuit for a fan positioned of an electronic device, the control circuit comprising:
   a temperature sensor configured to sense temperature of the electronic device and output a temperature signal;
   a fan controller coupled to the temperature sensor and the fan, and configured to control a speed of the fan according to the temperature signal received;
   a first power supply unit coupled to a power pin of the fan, the first power supply unit configured to supply power to the fan;
   a second power supply unit coupled to the power pin of the fan, the second power supply unit configured to supply power to the fan; and
   a control unit coupled to the first power supply unit and the second power supply unit, the control unit configured to cause the second power supply unit to operate in event the electronic device is in an active mode, and further configured to cause the first power supply unit to operate in event the electronic device is in a standby mode;
   wherein the control unit comprises a first electronic switch, a second electronic switch, first to fourth resistors, and first to third capacitors, a control terminal of the first electronic switch is coupled to a system power supply through the first resistor, a control terminal of the first electronic switch is also coupled to ground through the first capacitor and the second resistor in parallel, a first terminal of the first electronic switch is coupled to a standby power supply through the third resistor, a second terminal of the first electronic switch is coupled to ground, the first terminal of the first electronic switch is coupled to the second power supply unit, the first terminal of the first electronic switch is also coupled to ground through the second capacitor, a control terminal of the second electronic switch is coupled to the first terminal of the first electronic switch, a first terminal of the second electronic switch is coupled to the standby power supply through the fourth resistor, a second terminal of the second electronic switch is coupled to ground, the first terminal of the second electronic switch is coupled to the first power supply unit, the first terminal of the second electronic switch is also coupled to ground through the third capacitor.

2. The control circuit of claim 1, wherein the first power supply unit comprises a resistor and an electronic switch, a control terminal of the electronic switch is coupled to the control unit through the resistor, a first terminal of the electronic switch is coupled to a standby power supply, a second terminal of the electronic switch is coupled to the power pin of the fan.

3. The control circuit of claim 2, further comprising a fuse, wherein the second terminal of the electronic switch is coupled to the power pin of the fan through the fuse.

4. The control circuit of claim 2, wherein the electronic switch is a p-channel field-effect transistor (FET), and the control terminal, the first terminal, and the second terminal of the electronic switch are a gate, a source, and a drain of the FET, respectively.

5. The control circuit of claim 1, wherein the second power supply unit comprises a resistor and an electronic switch, a control terminal of the electronic switch is coupled to the control unit through the resistor, a first terminal of the electronic switch is coupled to a system power supply, a second terminal of the electronic switch is coupled to the power pin of the fan.

6. The control circuit of claim 5, wherein the electronic switch is a p-channel FET, and the control terminal, the first terminal, and the second terminal of the electronic switch are a gate, a source, and a drain of the FET, respectively.

7. The control circuit of claim 1, wherein the first electronic switch is an n-channel FET, and the control terminal, the first terminal, and the second terminal of the first electronic switch are a gate, a source, and a drain of the FET, respectively.

8. The control circuit of claim 1, wherein the second electronic switch is an n-channel FET, and the control terminal, the first terminal, and the second terminal of the second electronic switch are a gate, a source, and a drain of the FET, respectively.

* * * * *